(12) United States Patent
Hanrahan

(10) Patent No.: US 6,792,588 B2
(45) Date of Patent: Sep. 14, 2004

(54) FASTER SCALABLE FLOORPLAN WHICH ENABLES EASIER DATA CONTROL FLOW

(75) Inventor: Shaila Hanrahan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/824,990

(22) Filed: Apr. 2, 2001

(65) Prior Publication Data

US 2002/0144229 A1 Oct. 3, 2002

(51) Int. Cl.[7] .................. G06F 17/50; H03K 17/693
(52) U.S. Cl. ............... 716/17; 716/9; 326/41; 327/565
(58) Field of Search ................... 716/8–11, 17; 326/39, 41; 708/332, 334, 335, 524; 327/407, 565

(56) References Cited

U.S. PATENT DOCUMENTS

| | | | | |
|---|---|---|---|---|
| 5,455,525 A | * | 10/1995 | Ho et al. | 326/41 |
| 5,915,123 A | * | 6/1999 | Mirsky et al. | 326/39 |
| 6,154,051 A | * | 11/2000 | Nguyen et al. | 326/41 |
| 6,330,660 B1 | * | 12/2001 | Ganapathy et al. | 712/41 |

* cited by examiner

Primary Examiner—Tuan T. Lam
Assistant Examiner—Terry L. Englund
(74) Attorney, Agent, or Firm—Blakely, Sokoloff, Taylor & Zafman LLP

(57) ABSTRACT

A floorplan for a reconfigurable chip uses slices adjacent to each of four corners of a region, each of the slices including tiles that contain multiple reconfigurable functional units including ALUs. The placement of the slices in the corners of their region allows for better and quicker interconnection between elements on the slices.

24 Claims, 7 Drawing Sheets

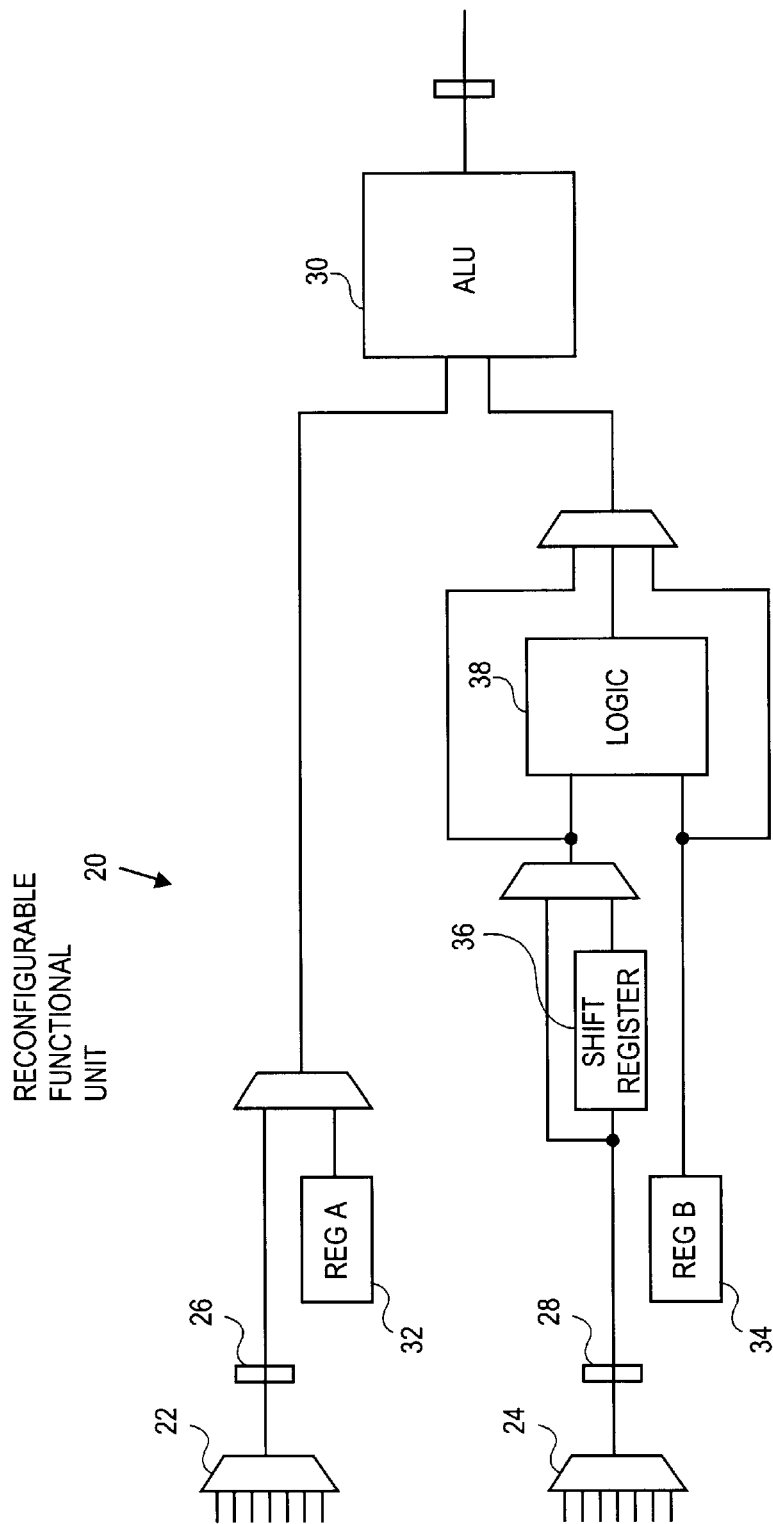

US 6,792,588 B2

FASTER SCALABLE FLOORPLAN WHICH ENABLES EASIER DATA CONTROL FLOW

BACKGROUND OF THE INVENTION

The present invention relates to reconfigurable chips. Reconfigurable chips are chips that can be configured to a number of different uses. A reconfigurable chip that recently has been found to be quite useful is a reconfigurable chip used to implement an algorithm, such as a communications system algorithm. Sections of the algorithm are swapped in and out of the reconfigurable chip as needed.

FIG. 1 shows a prior-art floorplan for such a reconfigurable chip. In floorplan 40 is shown an ASIC portion 42 which implements a central processor unit and other logic needed for the reconfigurable chip. Also shown is a reconfigurable fabric section 44 which implements the reconfigurable logic of the system. In one embodiment, the fabric 44 is divided into slices such as slice 46. Each of the slices is composed of a number of tiles 48. Each of the tiles contains a number of reconfigurable functional units, or data path units. These reconfigurable functional units preferably use a dedicated arithmetic logic unit (ALU). Preferably, the elements within a region such as slices and tiles are more interconnected than elements in different regions.

A disadvantage with the division of slices as shown in FIG. 1 is that the reconfigurable fabric portion 44 tends to be longer than it is wide. These long interconnections make it difficult to meet timing requirements, especially for connections between the ASIC portion 42 and the portions on the far side of a slice. The resistive/capacitive (RC) constant for these interconnection regions tends to be relatively high, producing a longer flight time with relatively slow rise and fall times resulting in a relatively high power dissipation.

It is desired to have an improved floorplan that improves on the timing for interconnection of elements on a reconfigurable chip.

SUMMARY OF THE PRESENT INVENTION

One embodiment of the present invention comprises a region on the reconfigurable chip including four slices, each of the slices being adjacent to a corner of the region. Each slice has multiple tiles; each tile has multiple reconfigurable logic units; and each reconfigurable logic unit includes an arithmetic logic unit.

By placing the slices adjacent to each corner of the region on the reconfigurable chip, the interconnection time between the reconfigurable logic units on the chip is reduced. Additionally, the regions with slices in the four corners have an aspect ratio closer to one than when elongated slices are used.

In one embodiment, the slices are rectangular. In another embodiment the slices are L-shaped to allow a center logic portion within the region. The regions described above have the advantage in that they can be placed within an even greater sized region of the floorplan. Four such regions can be put in the corners of an even greater region on the chip. The regions of the present invention are thus much more scalable for additional designs.

Another embodiment of the present invention uses a multiplexer receiving inputs from at least three reconfigurable logic units. The multiplexer is operably connected to an interconnect bus. Such an interconnection system using such multiplexer helps remove the tri-state buffers from the bus system and thus reduces the RC constant for this system and reduces the interconnection times. This multiplexer system has a slight downside in that it reduces some of the interconnection flexibility. However, in many cases, the interconnection speed benefit outweighs this disadvantage.

BRIEF DESCRIPTION OF THE DRAWINGS

FIG. 7 is a design of a reconfigurable functional unit including an arithmetical logic unit.

DETAILED DESCRIPTION OF THE PREFERRED EMBODIMENT

Figure 1:
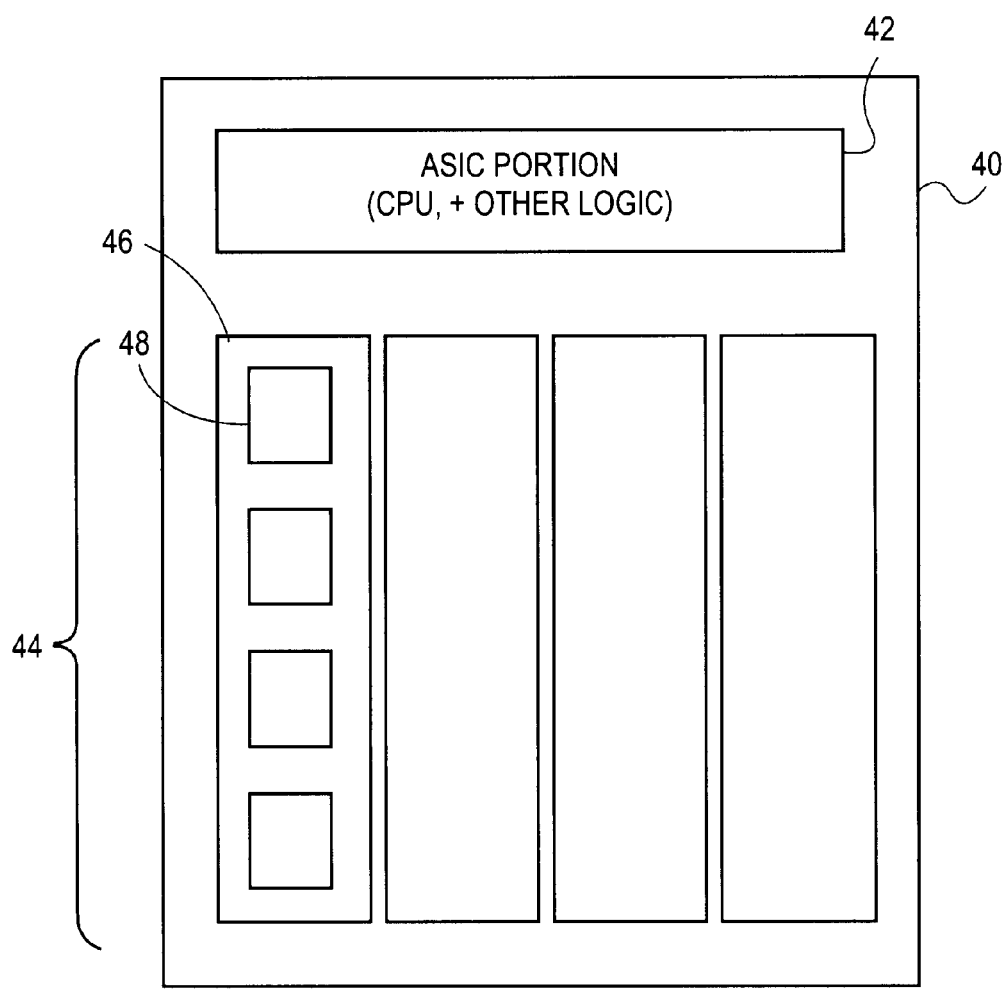
FIG. 1 illustrates a prior-art floorplan design for a reconfigurable logic chip.
Figure 2:
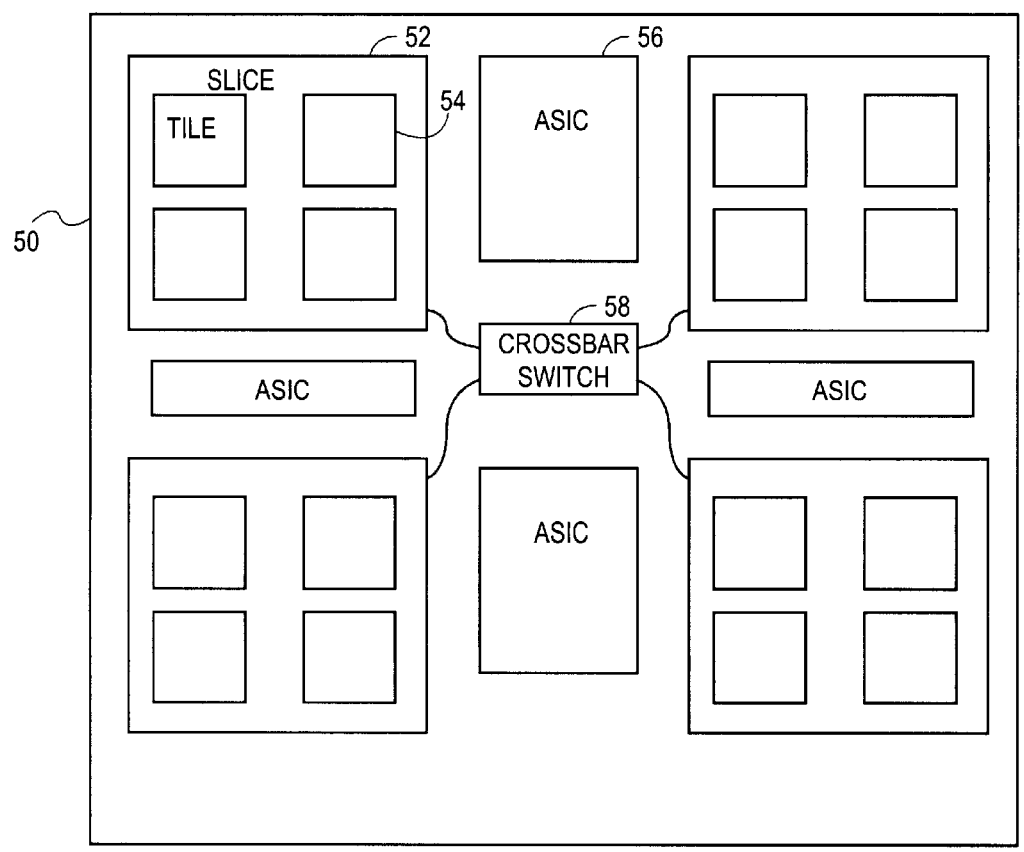
FIG. 2 illustrates one example of a floorplan of a reconfigurable logic system of the present invention.

FIG. 2 illustrates a design for a floorplan region for use in a reconfigurable logic chip. The region 50 includes slices 52. Slices 52 include tiles 54. The slices 52 are placed adjacent to the corners of the region 50. This arrangement allows the entire region 50 to be more square-shaped with an aspect ratio closer to one. This also reduces the interconnection distances between many of the elements on different tiles of the reconfigurable chip. The ASIC elements can be placed in regions such as region 56 between the different slices. In one embodiment a crossbar switch or other switch 58 is used to interconnect the slices.

Figure 3:
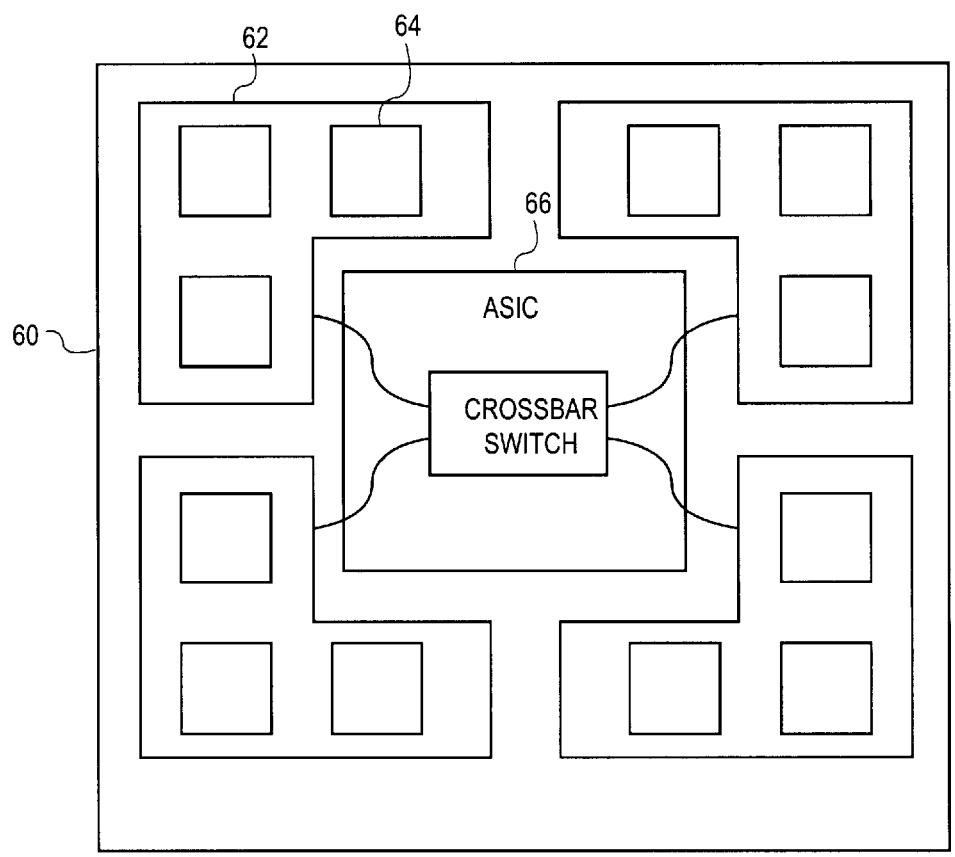
FIG. 3 illustrates another embodiment of a floorplan or region of a reconfigurable chip of the present invention.

FIG. 3 illustrates an alternate embodiment of a region for a reconfigurable chip. Region 60 includes slice 62. Slice 62 includes tile 64. Using an L-shaped slice 62 has the advantage that it allows for a center ASIC region 66; it has the slight disadvantage that fewer of the tiles can be placed in each slice. In this example, three tiles are used in each slice rather than four tiles of the example of FIG. 2.

Although this area is called a slice, it is clear from FIGS. 2 and 3 that these slices are preferably not elongated as shown in the prior art. Indeed, the terms "slice", "tile", and "region" are used in the present invention and claims merely to indicate different areas on the floorplan of a reconfigurable logic chip and are not meant in any further geometrically descriptive sense.

The regions of FIGS. 2 and 3 can be the entire reconfigurable chip or multiple regions can be arranged within a larger region.

Figure 4:
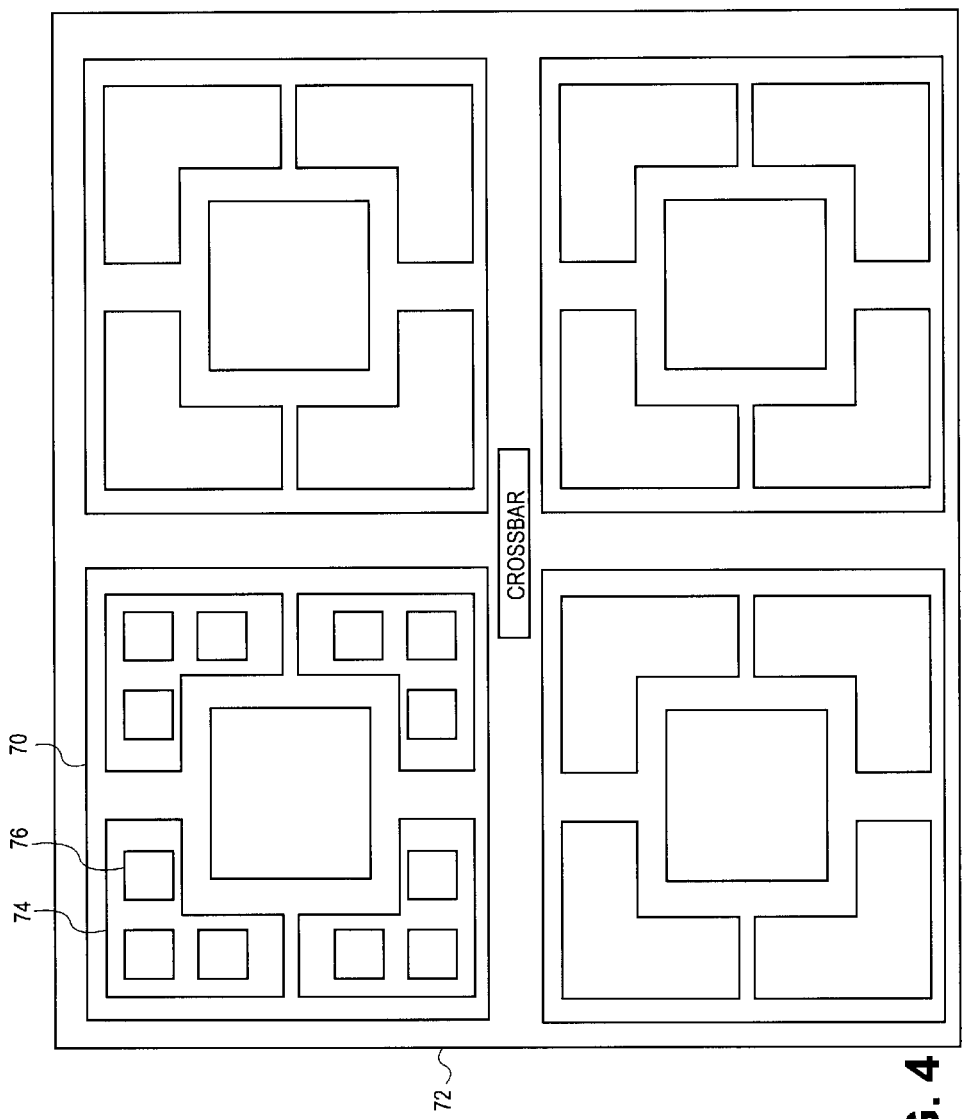
FIG. 4 is a design using a multiple of the regions of FIG. 3 into a larger region.

FIG. 4 illustrates a system in which multiple regions 70 are placed within a larger region 72, regions 70 including slices 74 and tiles 76. Note that the regions of FIGS. 2 and 3, because of the aspect ratio closer to one and because of the relatively short interconnection distances between elements on the chip, tend to be quite scalable, meaning that they can be further connected together into a larger region for a reconfigurable chip. This means that a specific design for a reconfigurable chip can have a greater reuse in the next generation reconfigurable chips.

Figures 5A, 5B:
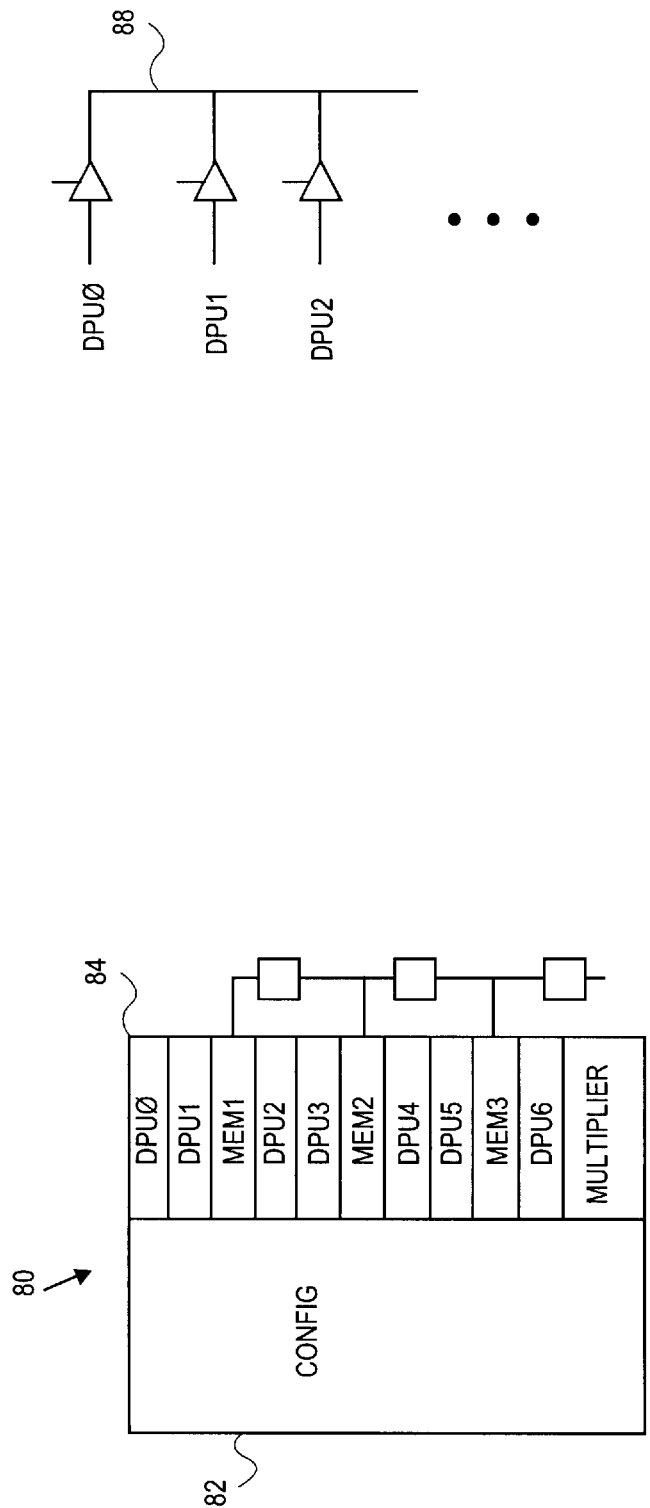
FIGS. 5A and 5B are prior-art designs for the datapath used in a tile.

FIG. 5 illustrates a prior-art example of a tile structure 80. This tile structure includes a configuration memory 82 along with a number of datapath units 84, the datapath units being a reconfigurable functional unit preferably containing an arithmetic logic unit (ALU). The interconnection between the data path units in the tile is typically done by a bus structure such as that shown in FIG. 5B, in which multiple tri-state drivers are connected to a bus. This embodiment of FIG. 5B has a disadvantage that the number of tri-state drivers further adds to the slowing of the transmission of signals across the bus 88.

Figure 6B:
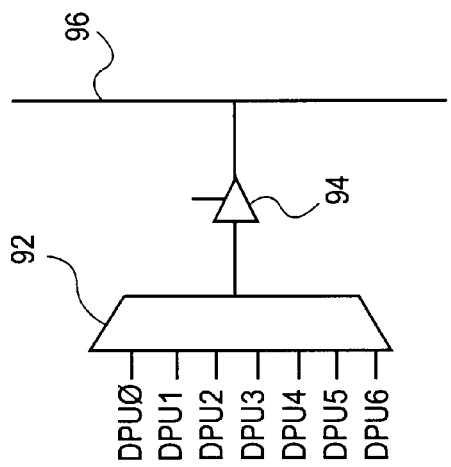
FIGS. 6A and 6B show designs for replacing datapath units within the tile.
Figure 6A:
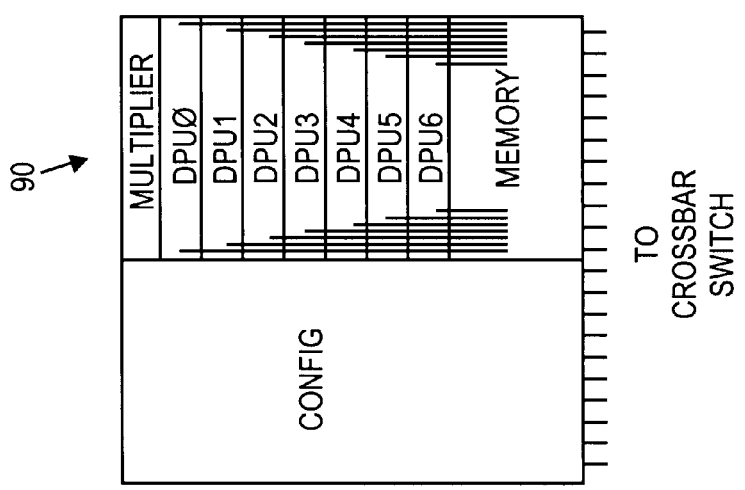

FIG. 6A illustrates an alternate embodiment of a tile structure 90. One interconnection system is shown in FIG. 6B in which a multiplexer 92 is connected to more than three of the datapath units; in this case, all of the datapath units in the tile 90. The output of the multiplexer 92 is sent to the tri-state buffer 94. The bus 96 is connected to many fewer tri-state buffers and can thus speed up the interconnection of the system of the present invention due to the reduced RC constant for the bus 96. Use of the multiplexer 92 reduces the flexibility of the bus 96; however, in many situations, the increase in speed compensates for this disadvantage.

FIG. 7 is a diagram of a reconfigurable functional unit or datapath unit 20. The datapath unit includes input multiplexers 22 and 24; buffers 26 and 28; registers 32 and 34; shift register 36; logic 38; additional internal multiplexers; and ALU 30.

The use of the ALU allows for distributive reconfigurable computing to be done on the reconfigurable chip. The reconfigurable functional units including the ALU are placed in tiles which are placed within slices which are placed within a region or regions on the reconfigurable chip.

It will be appreciated by those of ordinary skill in the art that the invention can be implemented in other specific forms without departing from the spirit or character thereof. The presently disclosed embodiments are therefore considered in all respects to be illustrative and not restrictive. The scope of the invention is illustrated by the appended claims rather than the foregoing description, and all changes that come within the meaning and range of equivalents thereof are intended to be embraced herein.

What is claimed is:

1. A reconfigured chip having one or more regions, each region comprising:
   a plurality of slices, four of the plurality of slices located adjacent to associated corners of the region;
   multiple tiles within each slice; and
   multiple reconfigurable logic units within each tile, each reconfigurable logic unit including an arithmetic logic unit; and
   an application specific integrated circuit (ASIC) disposed adjacent to one of the plurality of slices.

2. The reconfigured chip of claim 1, wherein one or more of the regions are arranged within a larger region of the chip.

3. The reconfigurable chip of claim 2, wherein the larger region has four corners and four of the one or more regions are located adjacent to the corners of the larger region.

4. The reconfigurable chip of claim 1, wherein the four of the plurality of slices are rectangular.

5. The reconfigurable chip of claim 1, wherein the four of the plurality of slices are square-shaped.

6. The reconfigurable chip of claim 1, wherein the four of the plurality of slices are L-shaped.

7. The reconfigurable chip of claim 1, wherein the one or more regions comprise a majority of the reconfigurable chip.

8. The reconfigurable chip of claim 1, wherein each of the one or more regions is rectangular.

9. The reconfigurable chip of claim 8, wherein each of the one or more regions has an aspect ratio close to one.

10. The reconfigurable chip of or claim 9, wherein each of the one or more regions is substantially square.

11. The reconfigurable chip of claim 1, further comprising one or more interconnect switches coupled between the slices.

12. The reconfigurable chip of claim 1, further comprising additional nonreconfigurable fabric units located outside of the tiles.

13. The reconfigurable chip of claim 4, wherein the ASIC is disposed adjacent to the four of the plurality of slices.

14. The reconfigurable chip of claim 6, wherein the ASIC is disposed within a central region defined by the four of the plurality of slices.

15. A reconfigurable chip, comprising:
   an application specific integrated circuit (ASIC) disposed adjacent to a slice, wherein the slice includes a tile,
   wherein the tile includes at least three reconfigurable logic units, each reconfigurable logic unit including an arithmetic logic unit; and
   a multiplexer to receive information from the at least three reconfigurable logic units, said multiplexer operably coupled to a bus.

16. The reconfigurable chip of claim 15, wherein the tile includes at least seven reconfigurable logic units are interconnected to the multiplexer.

17. The reconfigurable chip of claim 15, wherein the multiplexer is coupled to the bus using a tri-state driver.

18. The reconfigurable chip of claim 15, wherein the slice is arranged within a region.

19. The reconfigurable chip of claim 18, wherein there are four slices.

20. The reconfigurable chip of claim 19, wherein the four slices are located adjacent to a corner of the region.

21. The reconfigurable chip of claim 15, wherein the slice is rectangular.

22. The reconfigurable chip of claim 15, wherein the slice is square-shaped.

23. The reconfigurable chip of claim 15, wherein the slice is L-shaped.

24. The reconfigurable chip of claim 23, wherein the ASIC is disposed within a central region of the chip defined by the L-shaped slice.

* * * * *